(12) United States Patent
Schreiber

(10) Patent No.: US 11,048,479 B2
(45) Date of Patent: Jun. 29, 2021

(54) SOFTWARE CONVERSION SIMULATION MODE

(71) Applicant: SAP SE, Walldorf (DE)

(72) Inventor: Peter Schreiber, Wiesloch (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 16/368,068

(22) Filed: Mar. 28, 2019

(65) Prior Publication Data
US 2020/0310762 A1 Oct. 1, 2020

(51) Int. Cl.
 *G06F 8/10* (2018.01)
 *G06F 8/61* (2018.01)
 *G06F 30/20* (2020.01)

(52) U.S. Cl.
 CPC .............. *G06F 8/10* (2013.01); *G06F 8/64* (2013.01); *G06F 30/20* (2020.01)

(58) Field of Classification Search
 CPC ........................................................ G06F 8/10
 USPC ......................................................... 717/101
 See application file for complete search history.

(56) References Cited

U.S. PATENT DOCUMENTS

| 2001/0017023 A1* | 8/2001 | Armington | B65B 61/22 53/472 |
| --- | --- | --- | --- |
| 2003/0118081 A1* | 6/2003 | Philips | G06F 8/10 375/130 |
| 2004/0088685 A1* | 5/2004 | Poznanovic | G06F 8/447 717/140 |
| 2008/0313596 A1* | 12/2008 | Kreamer | G06Q 10/06 717/101 |
| 2010/0031228 A1* | 2/2010 | Rohe | G06F 11/3696 717/104 |
| 2011/0283253 A1* | 11/2011 | Dutta | G06F 8/10 717/105 |
| 2017/0293483 A1* | 10/2017 | Tian | H04L 67/34 |
| 2019/0073291 A1* | 3/2019 | Deutschle | G06F 11/3664 |

OTHER PUBLICATIONS

Anonymous "Updating SAP ABAP Systems on UNIX and Linux: SAP HANA DB" Jan. 21, 2019, 104 pages.

* cited by examiner

*Primary Examiner* — John Q Chavis
(74) *Attorney, Agent, or Firm* — Fountainhead Law Group P.C.

(57) ABSTRACT

Simulated software conversion offers advance warning of possible issues that may arise during a full conversion process. An engine interposed between a planner and an upgrade module interacts with the planner and an upgrade module to simulate compliance checks, and to reference a data model to simulate conversion tasks (e.g., simplification items, add-ons, custom code). The engine instructs the planner to continue (rather than halt/suspend) iterative interrogation of the existing production landscape to create an un-truncated stack.xml file, even when the planner encounters an unknown/unfamiliar software element. The upgrade module expects an incoming modified stack.xml file as input, that modified stack.xml file including additional information (such as a flag) referenced by the upgrade module to perform conversion compliance checks and other conversion tasks. The engine enriches the full stack.xml file received from the planner, creating the modified stack.xml file including additional information sent to the upgrade module.

20 Claims, 9 Drawing Sheets

PRIOR ART  FIG. 7

SOFTWARE CONVERSION SIMULATION MODE

BACKGROUND

Unless otherwise indicated herein, the approaches described in this section are not prior art to the claims in this application and are not admitted to be prior art by inclusion in this section.

Multi-faceted software landscapes are increasingly relied upon for the storage, manipulation, and analysis of large data volumes. According to one possible scenario, a software landscape may comprise distinct yet related software systems dedicated to processing logistical data and resource availability, respectively, for a given enterprise.

Such complex software landscapes may be converted to utilize different database platforms for storing data. Under such conditions, however, a customer may need to run and check many different sources in order to verify the readiness of their existing systems to undergo such a database conversion process.

SUMMARY

Embodiments simulate converting software between production environments. Particular embodiments interpose an engine between a planner and an upgrade module. The engine interacts with the planner and upgrade module to simulate compliance checks, and to reference a data model simulate conversion tasks (e.g., •simplification items, •creating add-ons, and •modifying custom code). The engine implements a handshake between the planner and the upgrade module. That handshake instructs the planner to continue (rather than halt/suspend) iterative interrogation of the existing production landscape to create an un-truncated stack.xml file, even when the planner encounters an unknown/unfamiliar software element. The handshake instructs the upgrade module to expect an incoming modified stack.xml file as input, that modified stack.xml file including additional information (such as a flag) referenced by the upgrade module to perform conversion compliance checks. The engine enriches the full stack.xml file received from the planner, creating the modified stack.xml file including additional information sent to the upgrade module. The ability to effectively simulate software conversion afforded by the modified stack.xml, offers early warning of possible conversion issues, in advance of the formal, resource-consuming conversion process.

An embodiment of a computer-implemented method comprises receiving an instruction to simulate conversion of a customer software system to a target software system. A handshake is communicated to a planner module in communication with the customer software system, and to an upgrade manager. In response to the handshake, a stack file is received from the planner module, the stack file indicating an unknown component of the customer software system. A target data model is referenced to enrich the stack file with additional information to create a modified stack file, wherein the additional information identifies a simplification item, an add-on, or custom code. The modified stack file is communicated to an upgrade manager to perform a conversion compliance check.

A non-transitory computer readable storage medium embodies a computer program for performing a method comprising receiving an instruction to simulate conversion of a customer software system to a target software system. A handshake is communicated to a planner module in communication with the customer software system, and to an upgrade manager. In response to the handshake, a stack.xml file is received from the planner module, the stack file indicating an unknown component of the customer software system. A target data model is referenced to enrich the stack file with additional information to create a modified stack file, wherein the additional information identifies a simplification item, an add-on, and/or custom code. The modified stack file is communicated to an upgrade manager to perform a conversion compliance check.

An embodiment of a computer system comprises one or more processors, and a software program, executable on said computer system. The software program is configured to cause an in-memory database engine to receive an instruction to simulate conversion of a customer software system to a target software system. The software program is configured to communicate a handshake to a planner module in communication with the customer software system, and to an upgrade manager. In response to the handshake, the software program is configured to cause the in-memory database engine to receive a stack file from the planner module, the stack file reflecting an unknown component of the customer software system. The software program is configured to enrich the stack file with additional information to create a modified stack file, and to communicate the modified stack file to an upgrade manager to perform a conversion compliance check.

In certain embodiments, the stack file is a first .xml file and the modified stack file is a second xml file.

According to particular embodiments, the modified stack file includes a flag reflecting the additional information.

In some embodiments, the stack file includes a placeholder indicating the unknown software component.

According to various embodiments the stack file is encrypted.

Certain embodiments further comprise encrypting the modified stack file.

In some embodiments the additional information is stored in a database.

Various embodiments further comprise storing security information in the database.

Particular embodiments further comprise storing the modified stack file in the database.

According to some embodiments the engine comprises an in-memory database engine of an in-memory database that also stores the stack file, the modified stack file, the additional information, security information for decrypting the modified stack file, simulated compliance check results, and/or database sizing information.

The following detailed description and accompanying drawings provide a better understanding of the nature and advantages of various embodiments.

DETAILED DESCRIPTION

Described herein are methods and apparatuses implementing simulation of a database conversion according to various embodiments. In the following description, for purposes of explanation, numerous examples and specific details are set forth in order to provide a thorough understanding of embodiments according to the present invention. It will be evident, however, to one skilled in the art that embodiments as defined by the claims may include some or all of the features in these examples alone or in combination with other features described below, and may further include modifications and equivalents of the features and concepts described herein.

Figure 1:
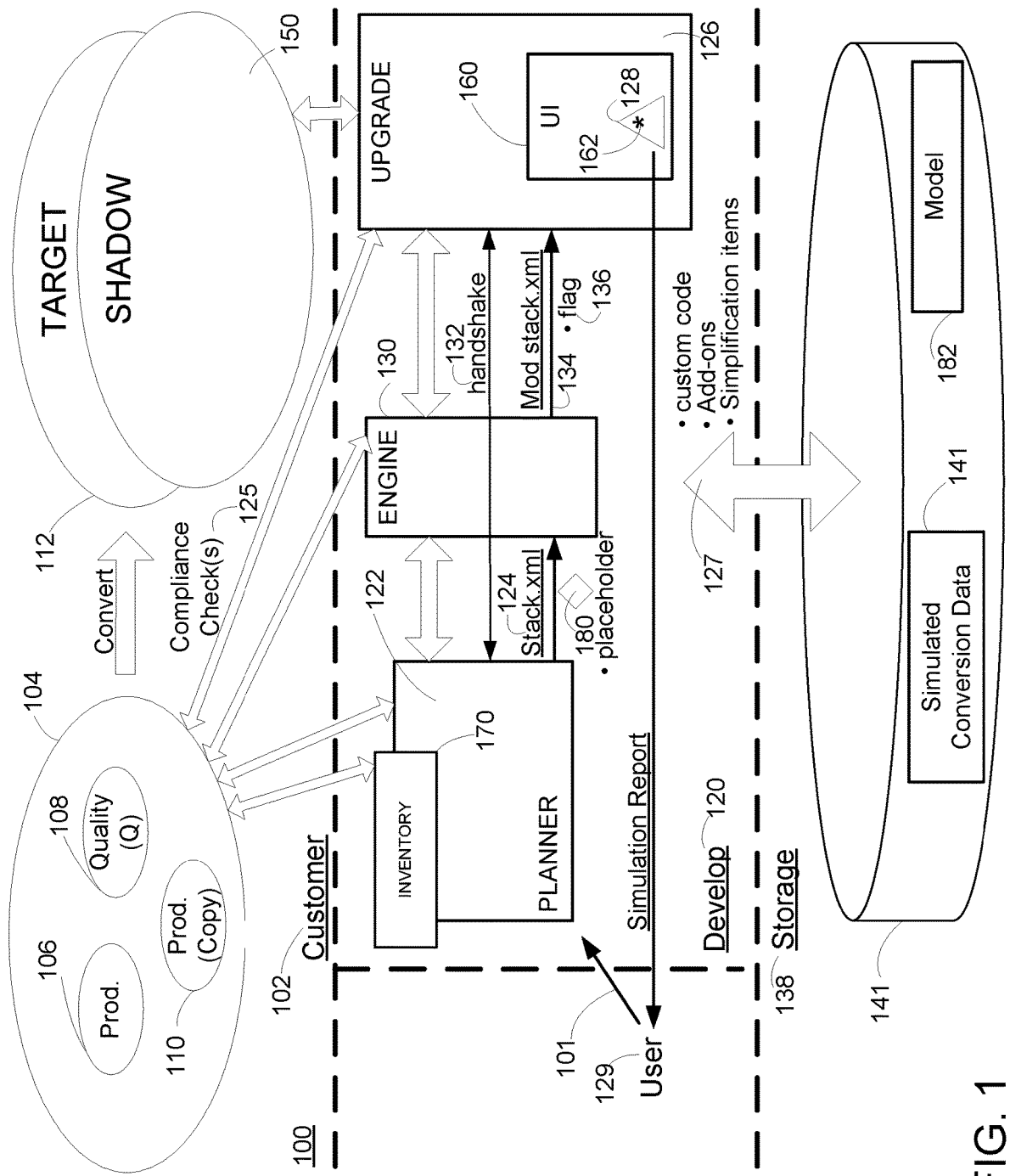
FIG. 1 shows a simplified diagram of a system according to an embodiment.

FIG. 1 shows a simplified view of an example system that is configured to perform conversion simulation according to an embodiment. Specifically, system 100 comprises a customer software landscape 102 that includes a software component 104.

In particular, the software component includes a fully operating production version 106. The software component may also include a quality (Q) version 108 having only a subset of the full production features and which is referenced for quality control purposes.

The software component within the customer landscape may also feature a copy 110 of the production version. That production copy may be created by the customer for use in testing or other purposes, without affecting operation of the production version As described herein, it may be desired to convert the software component to a new, target system 112. In order to proceed efficiently, the simulation of such a conversion process may involve multiple types of tasks, e.g., the simplification of data structures (•simplification items), the addition of software elements called for in the target (•Add-ons), and the modification of existing tailored customer code to accommodate the new target (•custom code). As discussed below, these and other conversion tasks are simulated with reference to a data model describing the target system.

In one possible example, such conversion could involve migrating a software system from the R3 production environment to the S/4HANA in-memory database platform available from SAP SE of Walldorf, Germany Details regarding that particular example are furnished later below in connection with FIGS. 3-6 and 9.

It is desired to perform this system conversion in an efficient manner, with minimal disruption of system operation. Accordingly, embodiments allow a user to simulate conversion of the system prior to conducting the actual resource-consuming and potentially disruptive conversion process.

This simulated conversion affords the user with early insight into potential problems or issues that could prolong the formal conversion. The user is thus afforded advance warning time to recognize possible problems and make changes to eliminate those problems, before they actually arise during the resource-consuming formal conversion process.

Accordingly, FIG. 1 further shows the development layer 120. That development layer receives a user request 101 to perform a simulated conversion process.

The development layer comprises planner 122 in communication with the software system that is to be converted. Planner 122 interrogates the software system, and identifies therein various elements of that system. Identified system elements are listed and described in the stack.xml file 124.

The planner may further comprise an inventory component 170. One example of such an inventory component is the Portfolio Project Management (PPMS) tool available from SAP SE, as described below in connection with FIG. 3.

The development layer of FIG. 1 further includes an upgrade manager 126. In response to receiving input listing specific components of the software system, the manager is responsible for performing compliance check(s) 125 upon the various elements of the customer's software system.

Examples of conversion tasks 127 that can be recognized and simulated according to various embodiments, can include but are not limited to:
simplification items,
Add-ons,
custom code, and
others.

An example of •simplification items arising during conversion, can be the movement of multiple tables into a single new table in the target. As further described below, this movement may be according to special rules dictated by a data model 182.

Regarding •Add-ons, these can represent additional software elements to be recognized as not yet having a corresponding successor in the target, and which need to be created. The effort and resources needed to create such an additional software element, can be recognized well in advance of the actual conversion process by utilizing simulation.

As for •Custom code conversion tasks, there the simulation recognizes that the existing customer system has tailored code, which for conversion purposes is to be altered to conform with new data model(s) in the target. Helpfully, such modified code can be identified proactively by performing conversion simulation.

The simulated compliance checks that are performed according to embodiments, may reveal advance insight into the readiness of system components for conversion process, as described in a simulation report 128 that is returned to the user 129, by the user interface (UI) component 160 of the upgrade manager. In addition to the results of simulated conversion compliance checking, the simulated report may also include database sizing information 162.

Conventionally, certain circumstances may interfere with the ability of the planner to provide a full and complete stack.xml file to the upgrade manager. Specifically, upon iterating through the customer system, the planner may at times encounter unfamiliar and/or unexpected system components. Examples of such components could be custom data objects specially created by the customer, and having a tailor-made structure.

Upon encountering such unfamiliar software components, the planner may simply halt, suspending its interrogation altogether. This can undesirably results in significant truncation of the stack.xml file, whose incomplete status reduces its value to the upgrade manager that will be performing the simulated conversion compliance check(s) 125.

Accordingly, the development layer further includes an engine 130. That engine lies interposed between the planner and the upgrade manager, in communication with each.

In particular, the engine is configured to issue a handshake 132 to both the planner and the upgrade manager. That handshake serves at least the two following functions.

First, the handshake instructs the planner to continue to compile the list of system elements for the stack.xml file, even where it encounters an unknown or unfamiliar feature. According to certain embodiments, the handshake may cause the planner to log the existence of the unknown feature (e.g., tailored customer code) with a placeholder 180, but then to move on uninterrupted to continue to interrogate the next element (rather than stopping completely).

Second, the handshake instructs the upgrade module to expect to receive a modified stack.xml file 134 as input. That modified stack.xml file is generated by the engine in response to the stack.xml file.

In particular, the modified stack.xml file includes additional information that is provided by the engine. For example, where the planner has originally logged an unfamiliar/unknown data object, the engine may add additional available information clarifying that data object (and the nature of conversion compliance checks to be performed thereon).

Such additional data may be included in the modified stack.xml file in the form of flag 136. That additional data may be present in an underlying storage layer 138, as part of the simulated conversion data 140 within the database 141.

Other pieces of data which may be stored as simulated conversion data, can include but are not limited to one or more of:
  the full (un-truncated) stack.xml file received from the planner;
  the modified stack.xml file (including flags) enriched by the engine;
  the passage/non-passage status of compliance checks by various software system elements of the modified stack.xml file; and
  security (encryption/decryption) information.

It is noted that according to certain embodiments, one or both of the stack.xml and the modified stack.xml file(s), may be encrypted in order to prevent their misuse. In some embodiments, this encryption may be performed by the engine upon receipt of the stack.xml file. Alternatively, the stack.xml file may be encrypted at the planner according to security information (e.g., keys) provided by the engine.

Decryption of the modified stack.xml file may be required prior to its handling by the upgrade manager. That decryption may be performed by the upgrade manager, prior to its executing the simulated conversion compliance check(s)

Apart from decryption concerns, the handshake offered by the engine may provide specific guidance to the upgrade manager in handling flagged data of the modified stack.xml file. For example, the handshake may instruct the upgrade manager to skip/suspend the performance of certain compliance check(s) upon flagged software system components. The handshake may provide alerts to the user regarding the existence of flagged system elements, and/or may highlight those flagged elements in the generated summary report.

As part of its operation, the upgrade manager may create a shadow iteration 150 of the target system. Such a shadow iteration is described in more detail below in connection with FIG. 5.

Figure 2:
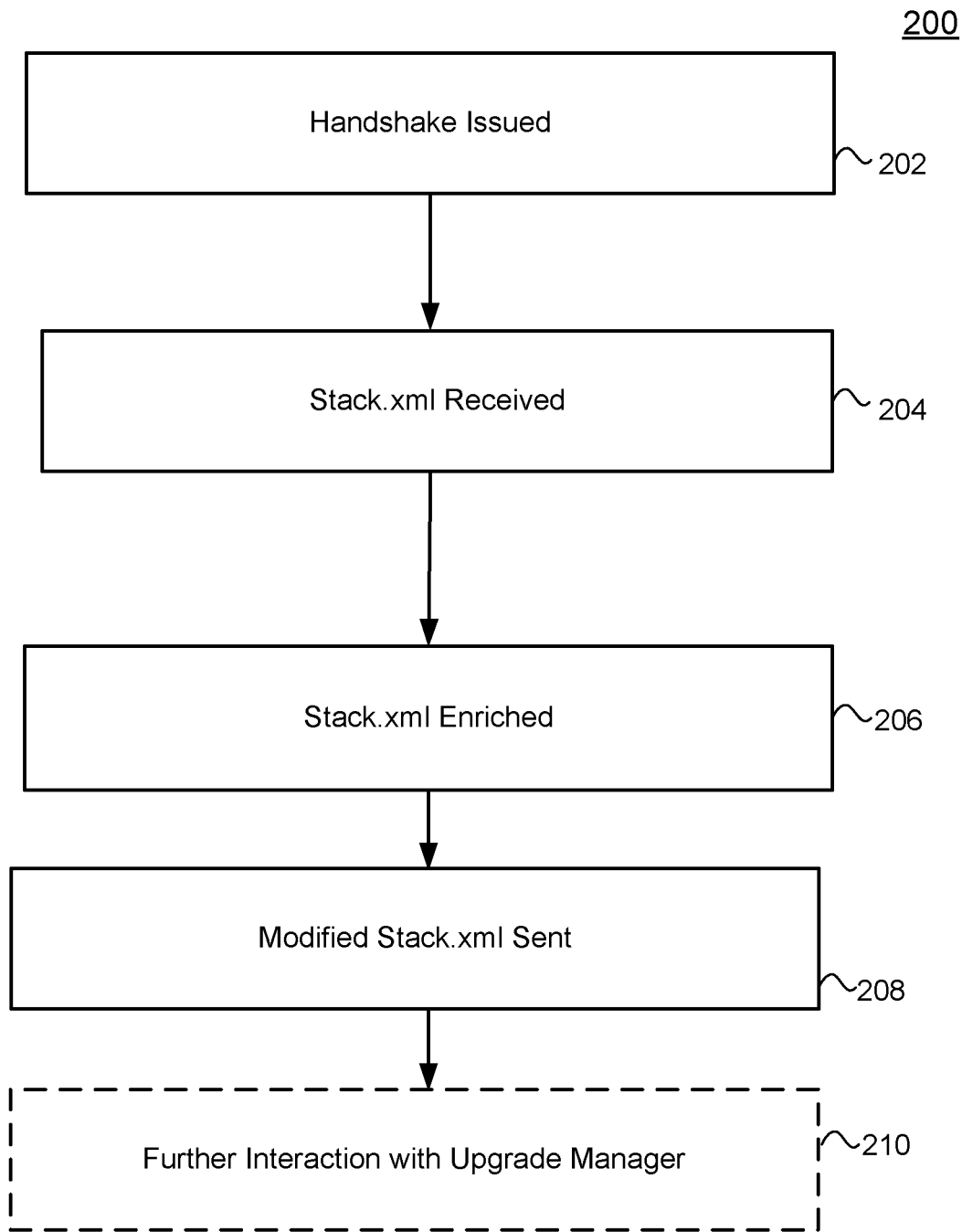
FIG. 2 shows a simplified flow diagram of a method according to an embodiment.

FIG. 2 is a flow diagram showing various actions taken in a method 200 according to an embodiment. At 202, an engine issues a handshake to a planner and an upgrade manager.

At 204, the engine receives an un-truncated stack.xml file from the planner. At 206, the engine processes the stack.xml file according to additional data from a storage layer, to create a modified stack.xml file. That additional data may identify conversion tasks such as simplification items, add-ons, custom code, and others, e.g., with reference to a data model of the target system.

At 208, the engine communicates the modified stack.xml file to the upgrade manager. At 210, the engine may optionally conduct further communication with the upgrade manager, provoked by additional information present in the modified stack.xml file that was sent.

Details regarding database conversion simulation are now provided in connection with a particular example involving specific elements that are available from SAP SE, of Walldorf, Germany.

EXAMPLE

The following example is taken from the productive implementation of embodiments in the context of conversion of EHP8 Enterprise Resource Planning (ERP) software available from ORACLE CORP of Redwood City, Calif., to the S/4 HANA in-memory database platform available from SAP SE.

Figure 9:
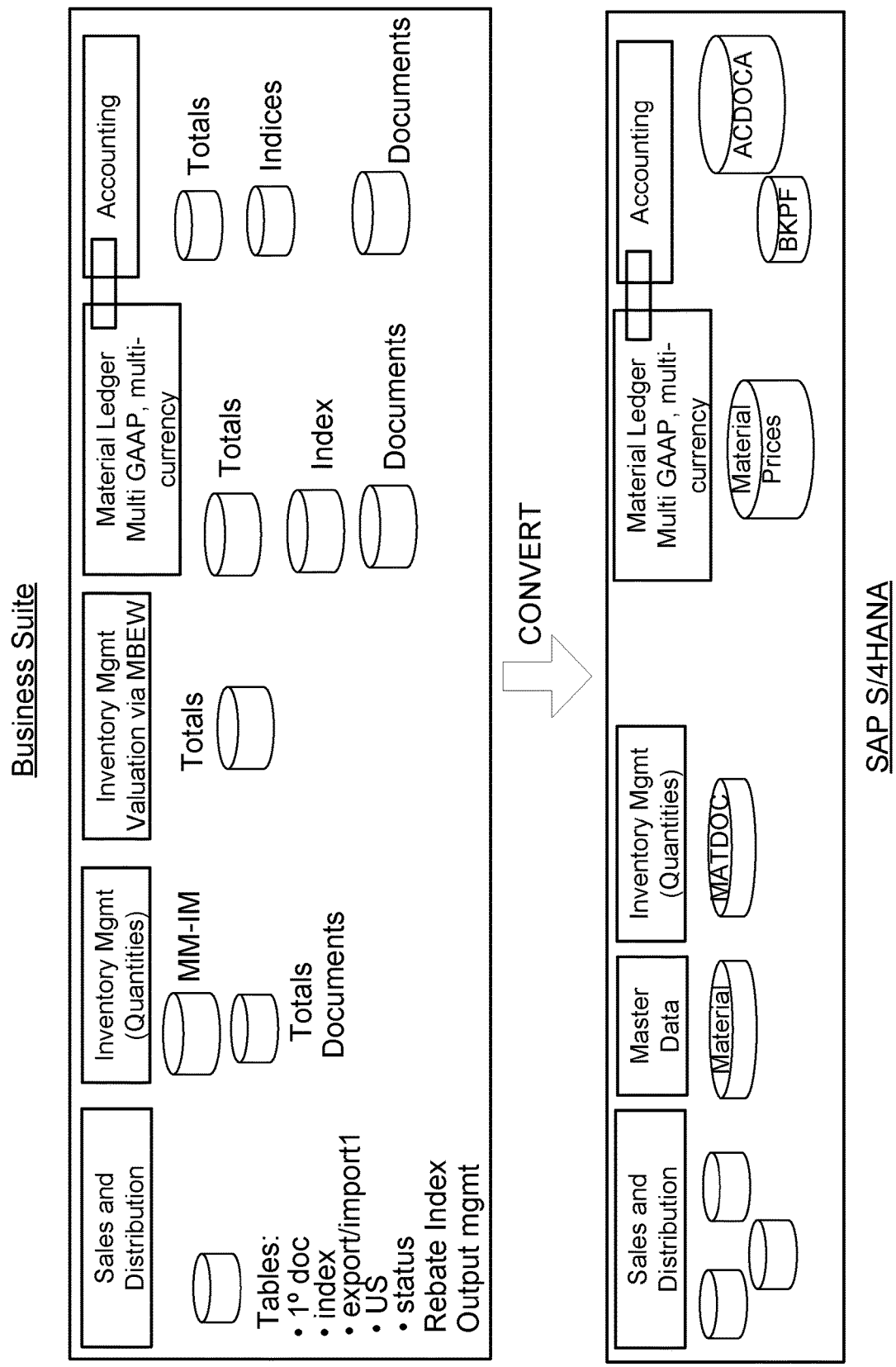
FIG. 9 is a simplified block diagram illustrating conversion simulation according to an example.

FIG. 9 is a simplified block diagram illustrating conversion according to the example. In particular, a business suite (e.g., ERP) is converted to the SAP S/4HANA database platform.

As shown in FIG. 9, this procedure involves converting to a simpler data model, with redundancies eliminated and only main tables remaining. This reduces memory footprint. Also, the conversion results in a clear separation between master data and transactional data.

Another result of the conversion is the simplification of processes. Here, only one valuation method—Material Ledger (ML) is used, rather than two (i.e., IM+ML). Also, flexible rebate management is permitted in place of cumbersome and expensive redundancies.

Moreover, conversion in this case permits an increase in throughput. With "INSERT" only on the database level (MM+IM), and no locks for standard price valuation.

As previously mentioned, in order to accomplish this conversion, a customer currently utilizing EHP8 ERP may need to run and check many different sources, in order to verify the readiness of their systems to convert to the S/4 HANA database platform. Examples of such conversion checking can include but are not limited to:
  readiness check;
  sizing report;
  custom code;
  modifications;
  simplification items;
  pre-checks;
  Add-ons;
  Business Function (BFs); and
  many others.

Ordinarily, performing even a few of these conversion checks during an actual conversion run can be both technically challenging, and highly consumptive of resources such as time, processing power, and available memory. Moreover, when approaching the conclusion of an actual conversion run executed by a Software Update Manager (SUM) module available from SAP SE, additional conversion tasks may further arise, requiring resolution. These late-arising tasks can contribute further inefficiency to conversion.

In particular, FIG. 9 shows that as part of the •simplification items, in the MM-IM area of the ERP (Business suite), many tables are moved with special rules to one new table→MATDOC. Such simplification can occur during many other aspect of the conversion process.

Other examples of conversion tasks that may be simulated according to embodiments, may include •Add-ons and •custom code. Add-ons may represent additional software components that do not have a successor yet in the S/4HANA environment. Custom code represents a conversion task where the customer must change his own, individual coding to conform with the new data models of S/4HANA.

Accordingly, embodiments function to offer a simulation mode to the SUM module, thereby furnishing an initial assessment of conversion tasks prior an actual conversion run. This advance conversion look offered by embodiments, permits a customer to test a conversion in advance and thereby conserve valuable effort and resources.

In this particular example, the SAP Maintenance Planner (MP) functions to offer a simulation mode. Here the MP creates a stack.xml, even where the original HANA database includes critical •Add-ons and/or •Business Functions (BFs).

This stack.xml offered for conversion simulation purposes, may be encrypted in order to avoid misuse. The stack.xml for simulation is provided to the SUM that is automatically deployed with the help of the saphostagent.

The deployed SUM then executes in the simulation mode upon a system, such as a shadow iteration that is created according to embodiments. This simulation involves minimal effort on the part of the customer, who is afforded with the shadow iteration without having to install an entirely new system.

In certain embodiments, the SUM operates in simulation mode upon the customer's actual production system, or a subset thereof. Alternatively, the simulation may invoke an existing copy of the customer's system, for example which may be maintained for various purposes.

According to some embodiments, the SUM may execute upon a subset of the full customer system. For example, the quality (Q) component of the customer's system may provide sufficient information (e.g., sizing, statistical), to allow for the database conversion simulation.

The SUM will perform checks, prechecks, and others listed above, without halting the conversion procedure.

Moreover, when operating in simulation mode, the SUM is not limited to interacting with a HANA database. Thus a HANA database is not required, and other database systems could be input for conversion.

Where the database that is input for conversion is the SAP HANA system, the SUM may in addition also run and return a sizing report for that in-memory database.

In this particular example, the SUM then runs until the shadow instance, where the modifications and custom code checks are performed. In this manner, the SUM gets reverted without any impact to the actual productive customer system.

The result of operation of database conversion simulation according to embodiments, is that the customer receives an overview reflecting one or more of:

pre-checks;
simplifications;
Add-ons
custom code checks.
BFs;
sizing (e.g., for HANA);
modifications; and
These may be included in report that is output, in addition to checks already performed by the SUM, which can include but are not limited to:
inactive objects;
TADIR check;
Nametab check;
versions of kernel;
database versions; and
others.

The implementation of embodiments according to this example, includes having the MP accommodate such simulation mode operation. This can involve the provision of a handshake between the MP and the SUM components.

For the SUM component, it is modified to extend the minimal impact scenario, for example to avoid stopping on error(s).

The modified SUM component does not require the existence of the HANA DB, and can include sizing information as part of the output summary.

Embodiments allow for the performance of a Custom code check on the shadow instance. A complete summary report may then be created leveraging the SUM's existing capability, with the complete summary report forwarded to user(s) to alert them to possible issues regarding database conversion that were raised by the simulation.

Figure 3:
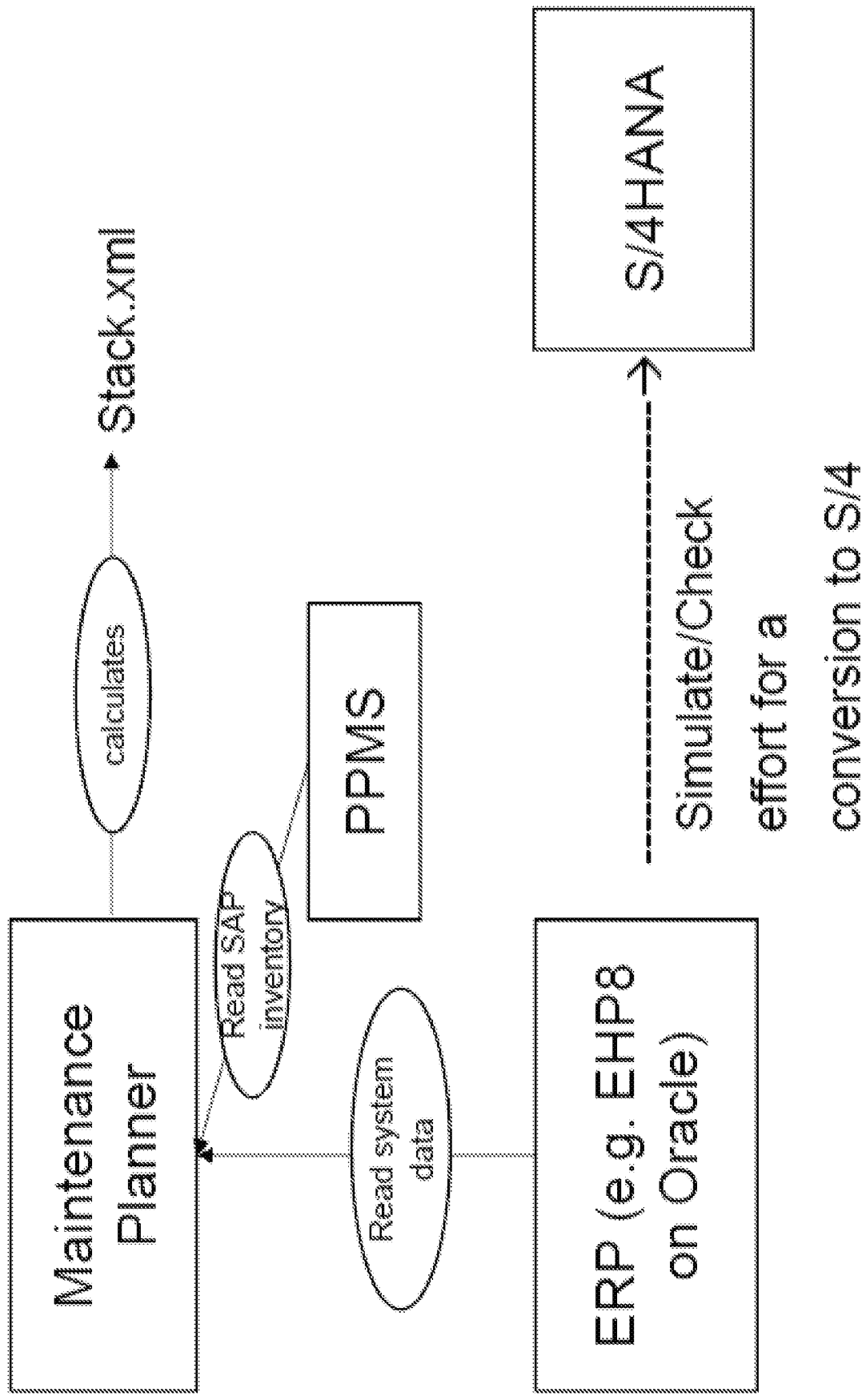
FIG. 3 is a simplified block diagram illustrating a first phase of simulated conversion compliance checking implemented according to a particular example, and showing the operation of the planner according to the simulation mode.

FIG. 3 shows a simplified view of the operation of the planner according to the simulation mode. Here, the full stack.xml will be created even where unknown/unfamiliar system elements are encountered during system interrogation. That stack.xml may be encrypted in order to avoid any possible misuse.

Figure 4:
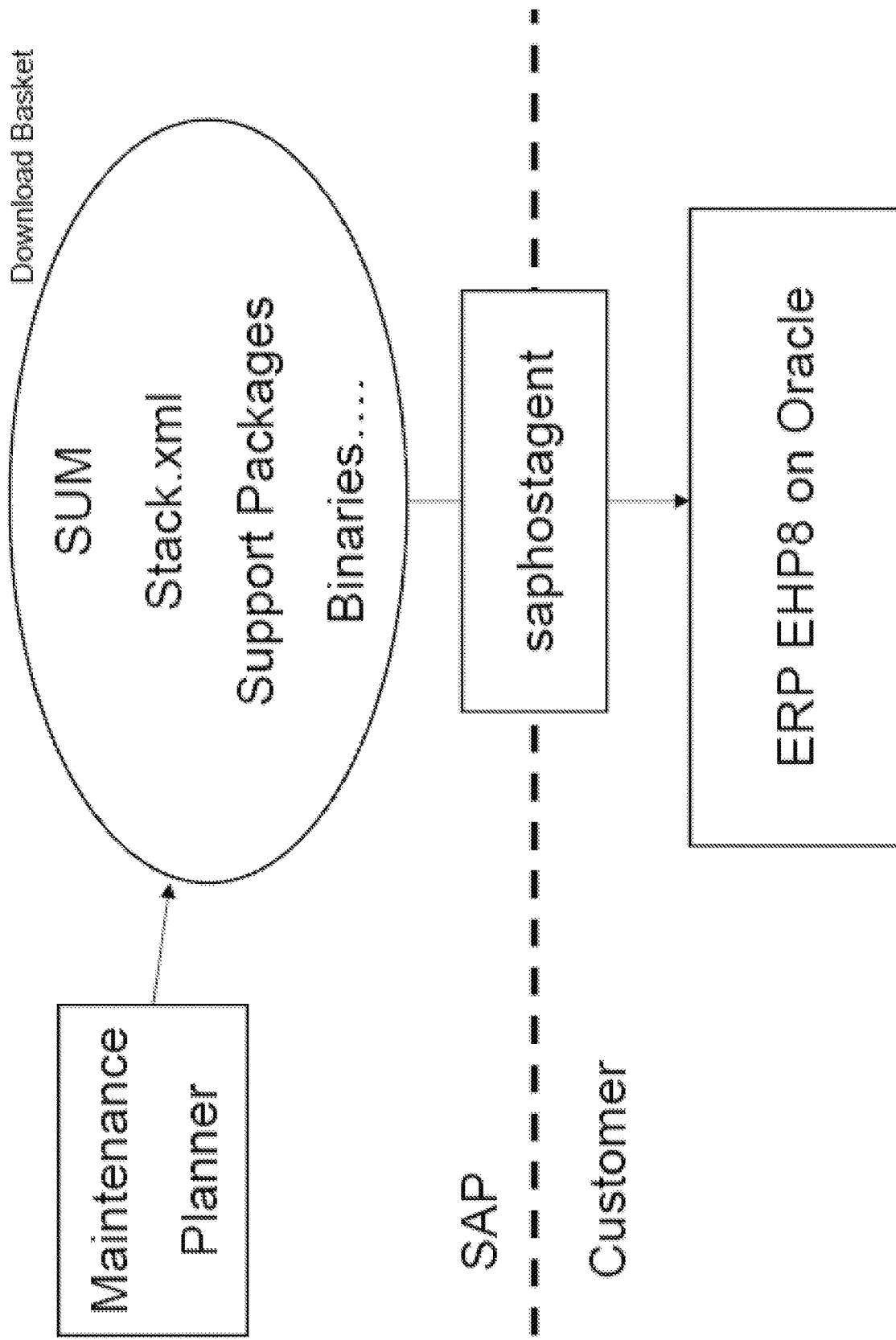
FIG. 4 shows a simplified view of a second phase of simulated conversion compliance checking where an automated download results in deploying software to the customer system.

FIG. 4 shows a simplified view of a second phase. Here, the automated download results in deploying software to the customer system.

Figure 5:
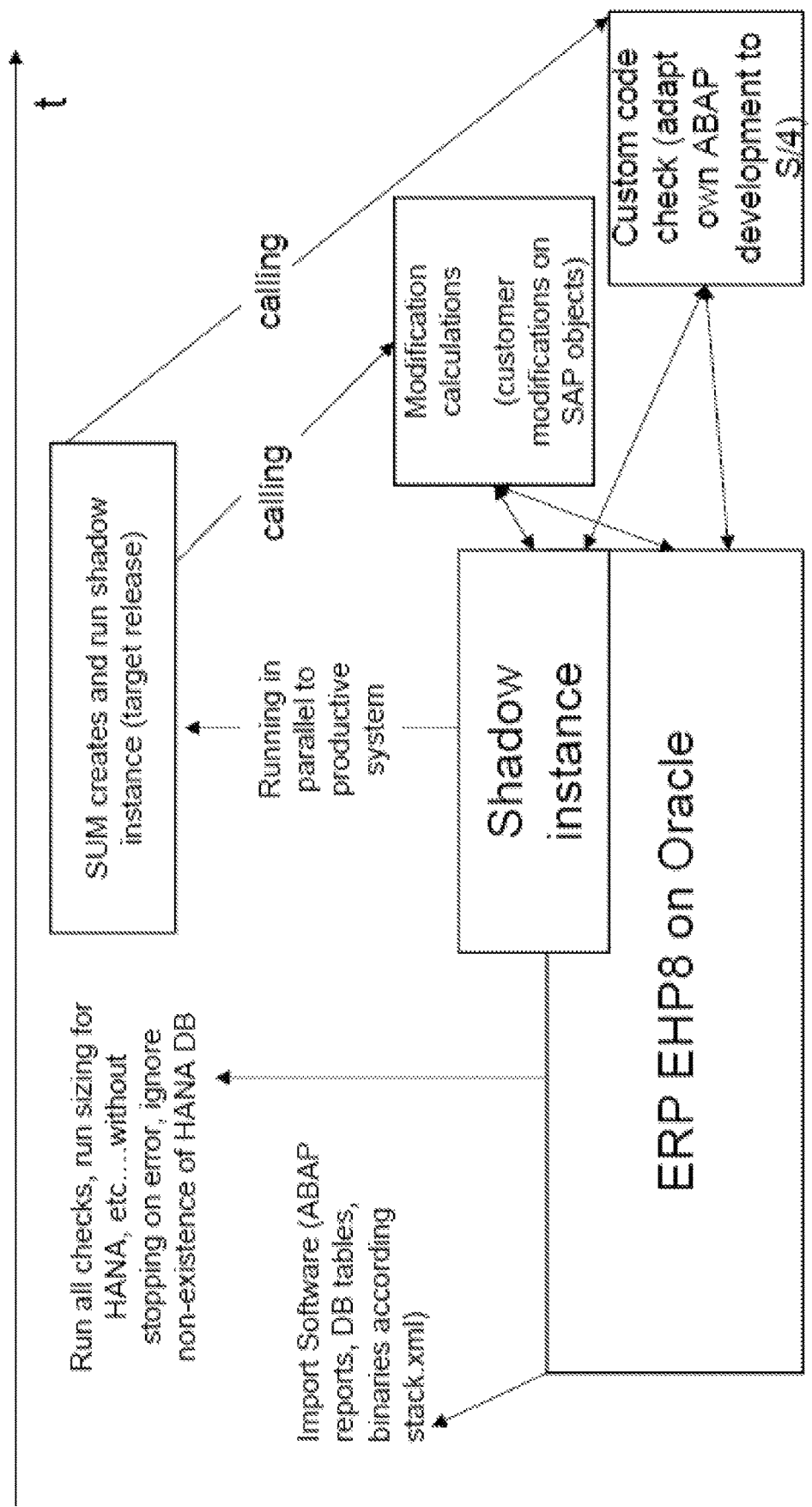
FIG. 5 shows a simplified view of the execution by the SUM, of performance checks over time (t), reflected by the horizontal axis.

FIG. 5 shows a simplified view of the execution by the SUM, of performance checks over time (t), reflected by the horizontal axis. Here, the start of SUM in simulation mode using stack.xml as API, with the SUM decrypts and "knows" the simulation mode. As shown in this figure, owing to the SUM's creation of the shadow iteration, the customer receives the target release "for free", while the original system remains productive.

Figure 6:
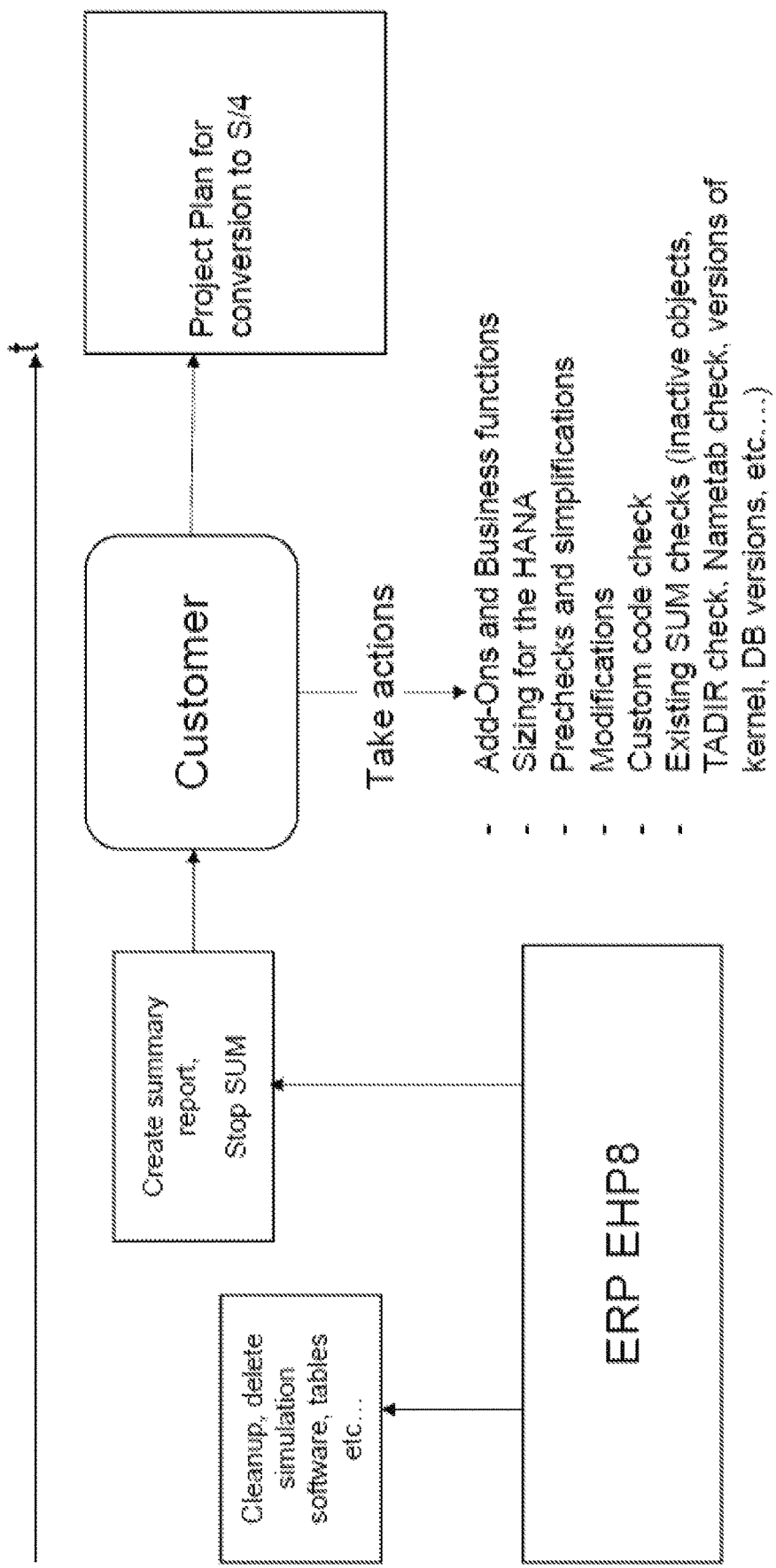
FIG. 6 is a simplified view showing a final phase, again with elapsed time (t) shown on the horizontal axis.

FIG. 6 is a simplified view showing a final phase, again with elapsed time (t) shown on the horizontal axis. This phase involves a cleanup and creation of the report by the SUM operating in the simulation mode. Again, the software system is not interrupted and remains productive.

Returning again to FIG. 1, while that figure shows the engine as being located outside the underlying database layer, this is not required. According to some embodiments, the engine could be present within the database layer. One possible example is where the engine is implemented to leverage the existing processing power available to the in-memory database engine of the SAP HANA in-memory database.

Figure 7:
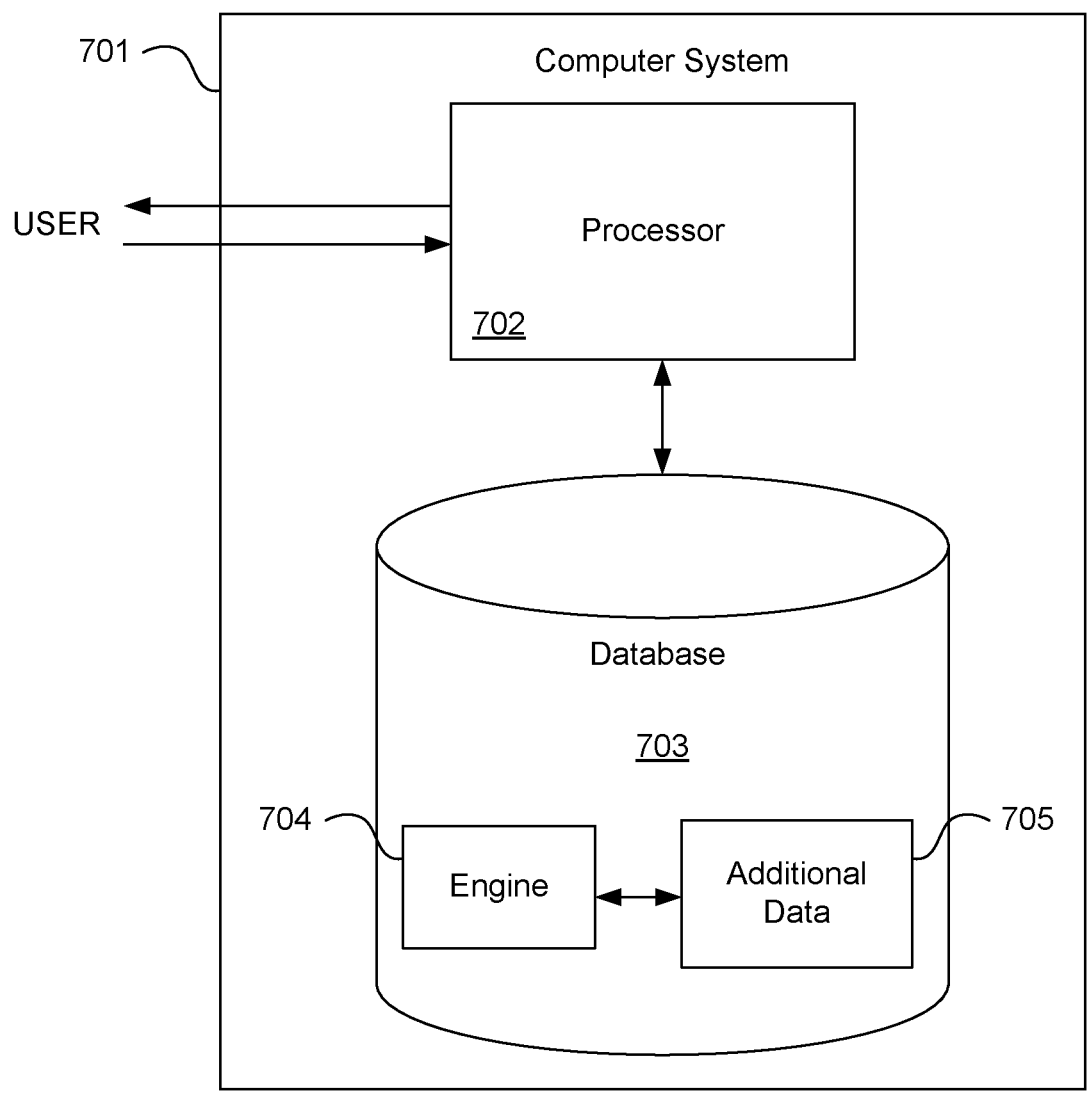
FIG. 7 illustrates hardware of a special purpose computing machine according to an embodiment that is configured to implement database conversion according to embodiments.

FIG. 7 illustrates hardware of a special purpose computing machine configured to implement database conversion simulation according to an embodiment. In particular, computer system 701 comprises a processor 702 that is in electronic communication with a non-transitory computer-readable storage medium comprising a database 703. This computer-readable storage medium has stored thereon code 705 corresponding to additional information to be referenced during conversion simulation. Code 704 corresponds to an engine. Code may be configured to reference data stored in a database of a non-transitory computer-readable storage medium, for example as may be present locally or in a remote database server. Software servers together may form a cluster or logical network of computer systems programmed with software programs that communicate with each other and work together in order to process requests.

Conversion simulation approaches according to embodiments may offer one or more benefits. In particular, implementing simulation at a relatively early stage of the conversion project offers an accurate and detailed overview of nearly all of the ToDos that are to be performed by the usage of the Maintenance Planner and the SUM.

In addition, simulated conversion can leverage existing functionality with relatively little modification. For example, the existing compliance checking capability of a SUM module can be leveraged to provide simulated check results, and those simulated results can be reported to the user through the SUM's existing interface.

Figure 8:
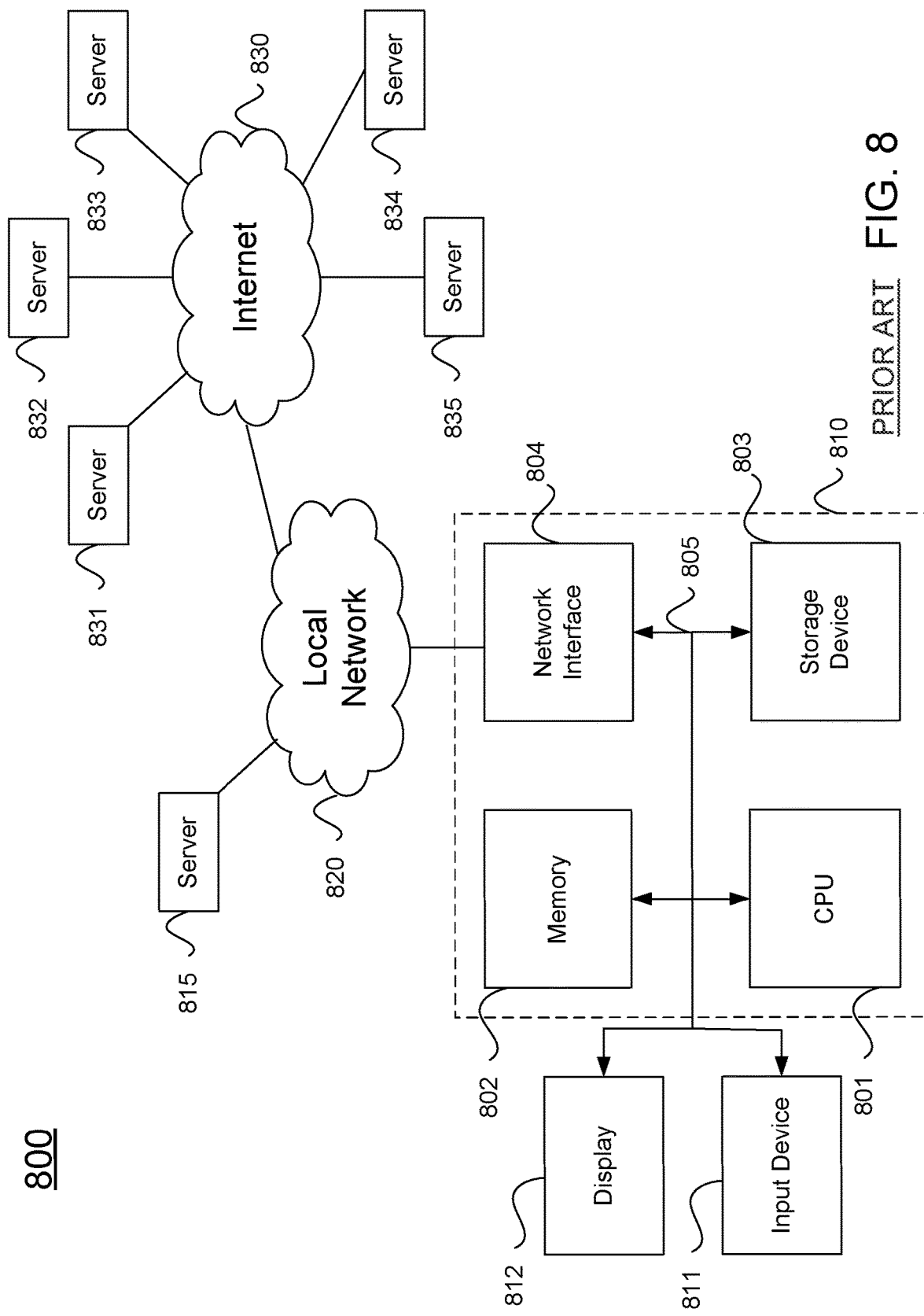
FIG. 8 illustrates an example computer system.

An example computer system 800 is illustrated in FIG. 8. Computer system 810 includes a bus 805 or other communication mechanism for communicating information, and a processor 801 coupled with bus 805 for processing information. Computer system 810 also includes a memory 802 coupled to bus 805 for storing information and instructions to be executed by processor 801, including information and instructions for performing the techniques described above, for example. This memory may also be used for storing variables or other intermediate information during execution of instructions to be executed by processor 801. Possible implementations of this memory may be, but are not limited to, random access memory (RAM), read only memory (ROM), or both. A storage device 803 is also provided for storing information and instructions. Common forms of storage devices include, for example, a hard drive, a magnetic disk, an optical disk, a CD-ROM, a DVD, a flash memory, a USB memory card, or any other medium from which a computer can read. Storage device 803 may include source code, binary code, or software files for performing the techniques above, for example. Storage device and memory are both examples of computer readable mediums.

Computer system 810 may be coupled via bus 805 to a display 812, such as a cathode ray tube (CRT) or liquid crystal display (LCD), for displaying information to a computer user. An input device 811 such as a keyboard and/or mouse is coupled to bus 805 for communicating information and command selections from the user to processor 801. The combination of these components allows the user to communicate with the system. In some systems, bus 805 may be divided into multiple specialized buses.

Computer system 810 also includes a network interface 804 coupled with bus 805. Network interface 804 may provide two-way data communication between computer system 810 and the local network 820. The network interface 804 may be a digital subscriber line (DSL) or a modem to provide data communication connection over a telephone line, for example. Another example of the network interface is a local area network (LAN) card to provide a data communication connection to a compatible LAN. Wireless links are another example. In any such implementation, network interface 804 sends and receives electrical, electromagnetic, or optical signals that carry digital data streams representing various types of information.

Computer system 810 can send and receive information, including messages or other interface actions, through the network interface 804 across a local network 820, an Intranet, or the Internet 830. For a local network, computer system 810 may communicate with a plurality of other computer machines, such as server 815. Accordingly, computer system 810 and server computer systems represented by server 815 may form a cloud computing network, which may be programmed with processes described herein. In the Internet example, software components or services may reside on multiple different computer systems 810 or servers 831-835 across the network. The processes described above may be implemented on one or more servers, for example. A server 831 may transmit actions or messages from one component, through Internet 830, local network 820, and network interface 804 to a component on computer system 810. The software components and processes described above may be implemented on any computer system and send and/or receive information across a network, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A computer-implemented method comprising:
receiving an instruction to simulate conversion of a customer software system to a target software system;
communicating a handshake instructing to continue compiling a stack file if unknown components are encountered to,
a planner module in communication with the customer software system, and
an upgrade manager;
in response to the handshake, receiving the stack file from the planner module, the stack file indicates an unknown component of the customer software system;
referencing a target data model to enrich the stack file with additional information to create a modified stack file, wherein the additional information identifies a simplification item, an add-on, or custom code; and
communicating the modified stack file to an upgrade manager to perform a conversion compliance check.

2. A method as in claim 1 wherein:
the stack file is a first .xml file; and
the modified stack file is a second xml file.

3. A method as in claim 1 wherein the modified stack file includes a flag reflecting the additional information.

4. A method as in claim 1 wherein the stack file includes a placeholder indicating the unknown software component.

5. A method as in claim 1 wherein the stack file is encrypted.

6. A method as in claim 1 further comprising encrypting the modified stack file.

7. A method as in claim 1 wherein the additional information is stored in a database.

8. A method as in claim 7 further comprising storing security information in the database.

9. A method as in claim 7 further comprising storing the modified stack file in the database.

10. A method as in claim 1 further comprising storing in an in-memory database engine of an in-memory database at least one of:
   the stack file;
   the modified stack file;
   the additional information;
   security information for decrypting the modified stack file;
   simulated compliance check results; and
   database sizing information.

11. A non-transitory computer readable storage medium embodying a computer program for performing a method, said method comprising:
   receiving an instruction to simulate conversion of a customer software system to a target software system;
   communicating a handshake instructing to continue compiling a stack file if unknown components are encountered to,
   a planner module in communication with the customer software system, and
   an upgrade manager;
   in response to the handshake, receiving the stack.xml file from the planner module, the stack file indicates an unknown component of the customer software system;
   referencing a target data model to enrich the stack file with additional information to create a modified stack file, wherein the additional information identifies a simplification item, an add-on, or custom code; and
   communicating the modified stack file to an upgrade manager to perform a conversion compliance check.

12. A non-transitory computer readable storage medium as in claim 11 wherein the modified stack.xml file includes a flag reflecting the additional information.

13. A non-transitory computer readable storage medium as in claim 11 wherein the stack.xml file includes a placeholder indicating the unknown software component.

14. A non-transitory computer readable storage medium as in claim 11 wherein the method further comprises encrypting the modified stack.xml file according to security information stored in a database.

15. A non-transitory computer readable storage medium as in claim 11 wherein the stack.xml file is encrypted.

16. A computer system comprising:
   one or more processors;
   a software program, executable on said computer system, the software program configured to cause an in-memory database engine to:
   receive an instruction to simulate conversion of a customer software system to a target software system;
   communicate a handshake to instructing to continue compiling a stack file if unknown components are encountered,
   a planner module in communication with the customer software system, and
   an upgrade manager;
   in response to the handshake, receive the stack file from the planner module, the stack file reflecting an unknown component of the customer software system;
   enrich the stack file with additional information to create a modified stack file; and
   communicate the modified stack file to an upgrade manager to perform a conversion compliance check.

17. A computer system as in claim 16 wherein the in-memory database stores at least one of:
   the stack file;
   the modified stack file;
   the additional information;
   simulated compliance check results; and
   database sizing information.

18. A computer system as in claim 16 wherein the modified stack file includes a flag reflecting the additional information, the modified stack file and the flag being stored in the in-memory database.

19. A computer system as in claim 16 wherein the stack file includes a placeholder indicating the unknown software component, the stack file and the placeholder being stored in the in-memory database.

20. A computer system as in claim 16 wherein the in-memory database engine encrypts the modified stack file according to security information stored in the in-memory database.

* * * * *